United States Patent
Gu et al.

(10) Patent No.: US 12,128,504 B2
(45) Date of Patent: Oct. 29, 2024

(54) METHOD OF CONSTRUCTING HIGH-FREQUENCY VIBRATORY STRESS RELIEF DEVICE FOR ELIMINATING RESIDUAL STRESS OF SMALL WORK-PIECE

(71) Applicant: Shanghai Maritime University, Shanghai (CN)

(72) Inventors: Bangping Gu, Shanghai (CN); Ping Wang, Shanghai (CN); Haoran Wu, Shanghai (CN); Xiong Hu, Shanghai (CN); Jiayi Zhuang, Shanghai (CN); Siqi Wang, Shanghai (CN); Zhipeng Huo, Shanghai (CN); Zhongshan Wang, Shanghai (CN)

(*) Notice: Subject to any disclaimer, the term of this patent is extended or adjusted under 35 U.S.C. 154(b) by 957 days.

(21) Appl. No.: 17/028,241

(22) Filed: Sep. 22, 2020

(65) Prior Publication Data

US 2021/0162548 A1    Jun. 3, 2021

(30) Foreign Application Priority Data

Dec. 3, 2019    (CN) .......................... 201911217458.1

(51) Int. Cl.
*B23K 26/382* (2014.01)
*B23G 1/02* (2006.01)
*G06F 30/23* (2020.01)

(52) U.S. Cl.
CPC .............. *B23K 26/382* (2015.10); *B23G 1/02* (2013.01); *G06F 30/23* (2020.01)

(58) Field of Classification Search
CPC ............ A61B 18/1442; A61B 18/1445; A61B 18/1447; A61B 18/1815; A61B 2017/0034; A61B 2017/00367; A61B 2017/00398; A61B 2018/00077; A61B 2018/00589; A61B 2018/00595; A61B 2018/00601; A61B 2018/00607; A61B 2018/0063; A61B 2018/00755; A61B 2018/00875; A61B 2018/00982; A61B 2018/00994;
(Continued)

(56) References Cited

FOREIGN PATENT DOCUMENTS

| CN | 101139653 A | 3/2008 |
|---|---|---|
| CN | 103757197 A | 4/2014 |

(Continued)

*Primary Examiner* — Nathaniel E Wiehe
*Assistant Examiner* — Ket D Dang
(74) *Attorney, Agent, or Firm* — Lei Jiang

(57) ABSTRACT

The present invention discloses a method of constructing a high-frequency vibratory stress relief device for eliminating residual stress of a small work-piece. The method comprises the following steps: fabricating a high-frequency vibration energy amplification device; fabricating a clamping device; mounting the high-frequency vibration energy amplification device; obtaining surface residual stress distribution on the small work-piece by means of X-ray diffraction; establishing a finite element model of the small work-piece; determining a target frequency f, determining the structural dimensions of the high-frequency vibration energy amplification device; analyzing the displacement mode to obtain loci of the vibration node lines and number of the vibration node lines; clamping the small work-piece; attaching strain gauges; connecting all devices. The present invention has the advantage of being able to increase the vibration energy acting on the small work-piece to achieve a better effect of high-frequency vibratory stress relief.

1 Claim, 17 Drawing Sheets

(58) Field of Classification Search
CPC .... A61B 2018/1455; A61B 2018/1823; A61B 2018/1861; B23G 1/02; B23K 2103/04; B23K 2103/10; B23K 26/362; B23K 26/382; B23K 26/40; G06F 30/23; H01M 10/052; H01M 10/0567; H01M 10/0568; H01M 10/0569; H01M 2004/027; H01M 2300/0034; H01M 2300/004; H01M 4/382; H01M 50/46; Y02E 60/10
USPC ...................................................... 219/121.6
See application file for complete search history.

(56) References Cited

FOREIGN PATENT DOCUMENTS

| | | |
|---|---|---|
| CN | 102766758 B | 8/2014 |
| CN | 109487073 A | 3/2019 |
| CN | 108130413 B | 6/2019 |

METHOD OF CONSTRUCTING HIGH-FREQUENCY VIBRATORY STRESS RELIEF DEVICE FOR ELIMINATING RESIDUAL STRESS OF SMALL WORK-PIECE

CROSS-REFERENCE TO RELATED APPLICATIONS

The subject application claims priority of the Chinese invention application CN201911217458.1 filed on Dec. 3, 2019 in China. The contents and subject matter thereof are incorporated herein by reference.

FIELD OF INVENTION

The present invention relates to the field of vibratory stress relief technology, and relates in particular to a method of constructing a high-frequency vibratory stress relief device for eliminating residual stress of a small work-piece.

BACKGROUND ART

Vibratory stress relief technology has a series of advantages such as good processing effect, low energy consumption, short processing time, less environmental pollution and so on. At present, it has been widely employed in various processes of mechanical processing and manufacturing. In addition, it has become an energy-saving and environment-friendly residual stress relief technology. A speed-adjustable motor is adopted as the exciter for the traditional low-frequency vibratory stress relief technology. As a result, the excitation frequency is generally less than 200 Hz, which shows that the optional vibration modes for the traditional low-frequency vibratory stress relief are very limited. Meanwhile, the residual stress is eliminated by means of integrally vibrating the work-piece for the traditional low-frequency vibratory stress relief technology, resulting in limited effect of prior art low-frequency vibratory stress relief technology in eliminating the local residual stress for the work-piece or the residual stress for the large complex work-piece. The electromagnetic exciter is adopted as the exciter for the high-frequency vibratory stress relief technology and its excitation frequency can reach 10 kHz, which extends the application range of the vibratory stress relief technology. However, the output vibration energy of the electromagnetic exciter is limited, resulting in limited residual stress relief when the work-piece is directly excited via the electromagnetic exciter. "High-frequency Vibratory Stress Relief System and Method Thereof for Eliminating Residual Stress of Small Work-piece" with the patent number CN103757197B discloses a high-frequency vibratory stress relief system suitable for eliminating the residual stress on a small work-piece and a method adapted to the system. Acceleration vibration level is employed to represent the vibration energy in its technical scheme, rendering it incapable to evaluate whether the residual stress on the small work-piece can be eliminated or not prior to the high-frequency vibratory stress relief treatment on the small work-piece, as the macroscopic condition of the high-frequency vibratory stress relief requires that the sum of the external dynamic stress and the internal residual stress of the material should exceed the yield limit of the material; while larger acceleration vibration level does not necessarily implicate that the external dynamic stress acting on the small work-piece satisfies the macroscopic condition of the high-frequency vibratory stress relief. Sweeping frequency method is employed to determine the excitation frequency of the high-frequency vibratory stress relief in the technical solution of the patent. Firstly, it takes a certain time to determine the excitation frequency of the high-frequency vibratory stress relief, and thus the high-frequency vibratory stress relief is inefficient. Secondly, the excitation frequency of the high-frequency vibratory stress relief determined via the sweeping frequency method does not consider distribution of the residual stress on the small work-piece. As a result, ideal residual stress eliminating effect is not obtainable via the high-frequency vibratory stress relief treatment under the excitation frequency determined via the sweeping frequency method. In addition, the small work-piece is rigidly mounted on the supporting platform in its technical solution. Thus, it is difficult for the small work-piece to vibrate according to its mode shape. Therefore, the residual stress eliminating effect of the high-frequency vibratory stress relief on the small work-piece is limited.

SUMMARY OF THE INVENTION

In order to solve the afore-mentioned problems in the prior-art high-frequency vibratory stress relief and to improve residual stress eliminating effect of prior art high-frequency vibratory stress relief, the present invention provides a method of constructing a high-frequency vibratory stress relief device for eliminating residual stress of a small work-piece.

The method of constructing a high-frequency vibratory stress relief device for eliminating residual stress of a small work-piece, the small work-piece having a length a, a width b and a thickness c, comprising the following steps:

(1) fabricating a high-frequency vibration energy amplification device: fabricating the high-frequency vibration energy amplification device by means of integrated molding, wherein the upper part thereof is a working platform in a shape of a cylinder, the middle part is a cone-shaped connecting rod, and the bottom part is a supporting platform in a shape of a cylinder; the small end of the cone-shaped connecting rod is connected with the surface center of the working platform, and the large end of the cone-shaped connecting rod is connected with the surface center of the supporting platform; determining structural dimensions $d_1$, $h_1$, $d_2$, $h_2$, $d_3$, $d_4$, and $h_3$ of the high-frequency vibration energy amplification device according to step (7), wherein $d_1$ is the diameter and $h_1$ the thickness of the working platform, $d_2$ is the diameter and $h_2$ the thickness of the supporting platform, $d_3$ is the diameter of the small end of the cone-shaped connecting rod, $d_4$ is diameter of the large end of the cone-shaped connecting rod and $h_3$ length of the cone-shaped connecting rod, under restrictions: $d_1=3\sim8b$, $h_1=2\sim6c$, $d_2=3\sim8b$, $h_2=2\sim6c$, $d_3=2\sim6c$, $d_4=2\sim6c$, $h_3=1\sim6b$, $d_1>d_3$, $d_2>d_4$, $h_3>h_1$, $h_3>h_2$;

(2) fabricating a clamping device: fabricating an adjusting device by integrated molding, wherein a first L-shaped column and a second L-shaped column are symmetrical at the two ends of an adjusting beam, with the two ends of the adjusting beam respectively on the top of the first L-shaped column and the top of the second L-shaped column; machining a rectangular chute on the adjusting beam, and machining a through hole each at the bottom part of the first L-shaped column and the bottom part of the second L-shaped column; with $l_1$ denoting the height of the first L-shaped column, which is equal to the height of the second L-shaped column, $b_5$ denoting the width of the first L-shaped column, which is equal to the width of the second L-shaped column, $h_{12}$ denoting the thickness of the first L-shaped column, which is equal to the thickness of the second L-shaped column, $l_3$ denoting the length of the bottom part of the first L-shaped column, which is equal to the length of the bottom part of the second L-shaped column, $d_8$ denoting the diameter of the through hole of the first L-shaped column, which is equal to the diameter of the through hole of the second L-shaped column, $h_4$ denoting the length of the adjusting beam, $b_3$ denoting the width of the adjusting beam, $h_{14}$ denoting the thickness of the adjusting beam, $a_1$ denoting the length of the rectangular chute of the adjusting beam, $b_1$ denoting the width of the rectangular chute. The interrelations there among are: $l_1=10\sim15c$, $b_5=0.5h_1$, $h_{12}=0.2h_1$, $l_3=0.5\sim1h_1$, $d_8=0.4l_3$, $h_4=1.2\sim2a$, $b_3=b_5$, $h_{14}=0.5\sim1h_{12}$, $a_1>a$, $b_1=0.5b_3$. Then fabricating a pressing device: machining external thread on both sides of a stepped threaded rod; machining a pressing beam with a cuboid in the middle thereof and a half cylinder at both ends thereof; machining a through hole on the center of the pressing beam; passing the small diameter of the stepped threaded rod through the through hole on the center of the pressing beam, and mounting the stepped threaded rod with the pressing beam via a nut; machining a rectangular chute on each side of the pressing beam; machining two pressing blocks to be in shape of a cylinder, and machining a threaded hole on the center surface of each pressing block, screwing a connecting threaded rod having external threads through the threaded hole respectively in each pressing block; passing each connecting threaded rod through each rectangular chute on the pressing beam, and mounting each pressing block with the pressing beam via a nut; with $d_5$ denoting the diameter and $h_5$ the length of the large diameter of the stepped threaded rod, $d_6$ denoting the diameter and $h_6$ the length of the small diameter of the stepped threaded rod, $a_2$ denoting the length, $b_4$ denoting the width and $h_{15}$ the thickness of the pressing beam, $d_{12}$ denoting the diameter of the half cylinder at the both ends of the pressing beam, $d_{13}$ denoting the diameter of the through hole in the center of the pressing beam, $h_{16}$ denoting the length and b, denoting the width of each rectangular chute of the pressing beam, $h_{17}$ denoting the farthest distance of each rectangular chute of the pressing beam from the center of the through hole in the center of the pressing beam, $d_9$ denoting the diameter and $h_7$ denoting the thickness of each pressing block, $d_{10}$ denoting the diameter and $h_8$ denoting the depth of each threaded hole on the center surface of each pressing block, $d_{11}$ denoting the diameter and $h_9$ denoting the length of each connecting threaded rod, inter-relations there among are: $d_5=0.9\sim1b_3$, $h_5=1\sim1.2l_1$, $d_6=0.5\sim0.8d_5$, $h_6=0.1\sim0.2h_5$, $a_2>b$, $b_4=0.05\sim0.1a$, $h_{15}=0.5h_6$, $d_{12}=b_4$, $d_6<d_{13}<d_5$, $h_{16}<0.5a_2$, $b_2=0.3\sim0.5b_4$, $0.5b\text{-}0.5d_9<h_{17}<0.5a_2$, $d_9=b_4$, $h_7=h_6$, $d_{10}=0.9\sim1b_2$, $h_8=0.5h_7$, $d_{11}=d_{10}$, $h_9=h_7$; passing the large diameter of the stepped threaded rod of the pressing device through the rectangular chute on the adjusting beam of the adjusting device, and mounting the stepped threaded rod with the adjusting beam via two nuts, one there-beneath and one there-above, thus forming the clamping device;

(3) mounting the high-frequency vibration energy amplification device: mounting the supporting platform of the high-frequency vibration energy amplification device on a vibration mesa of the moving part of an electromagnetic exciter via screws;

(4) obtaining surface residual stress distribution on the small work-piece by means of X-ray diffraction, determining the distribution region of the peak residual stress on the small work-piece, the direction of the first principal stress and the direction of the second principal stress, and storing the distribution region of the peak residual stress, the direction of the first principal stress and the direction of the second principal stress;

(5) employing a finite element software to establish a finite element model of the small work-piece, performing numerical modal analysis for the small work-piece to obtain the natural frequencies of the bending vibration of the various orders of the small work-piece, the displacement modes and strain modes of the bending vibration of the various orders corresponding to the natural frequencies, and storing the natural frequencies, the displacement modes and the strain modes of the bending vibration of the various orders of the small work-piece;

(6) determining the distribution region of the peak strain on each strain mode of the bending vibration according to the strain modes of the bending vibration of various orders stored in step (5), and storing the distribution region of the peak strain for each order; recording the natural frequency corresponding to the strain mode wherein the distribution region of the peak strain of the strain mode is consistent with the distribution region of the peak residual stress on the small work-piece, with a criterion as follows:

$$\frac{|X_r - X_\varepsilon|}{X_r} \times 100\% \le 5\%,$$

wherein $X_r$ denoting the coordinate of the starting position of the distribution region of the peak residual stress in the x-axis direction on the small work-piece, $X_\varepsilon$ denoting the coordinate of the starting position of the distribution region of the peak strain in the x-axis direction on the small work-piece; denoting the recorded natural frequency as a target frequency f for determining the structural dimensions of the high-frequency vibration energy amplification device;

(7) determining the structural dimensions $d_1$, $h_1$, $d_2$, $h_2$, $d_3$, $d_4$, and $h_3$ of the high-frequency vibration energy amplification device with the following steps:

1) obtaining the minimum value and the maximum value for each of the structural dimensions $d_1$, $h_1$, $d_2$, $h_2$, $d_3$, $d_4$, and $h_3$; divide the length with the starting point of the minimum value and the ending point of the maximum value for each structural dimension into N segments to obtain N+1 values of each parameter, wherein N is an integer between 3 and 60; formulating $(N+1)^7$ 7-tupples $(p_1, p_2, p_3, p_4, p_5, p_6, p_7)$ as schemes for the finite element model for the high-frequency vibration energy amplification device, wherein $p_i$ is one of the N+1 values of each respective structural dimensions, $i=1, \ldots, 7$;

2) performing numerical modal analysis for each scheme in step 1), and calculating $$\text{delta} = \frac{|f_a - f|}{f} \times 100\%;$$

selecting the scheme corresponding to the minimum value of the delta as the structural dimension scheme of the high-frequency vibration energy amplification device, with $f_a$ denoting the natural frequency of the first order axial vibration of the high-frequency vibration energy amplification device;

(8) analyzing the displacement mode corresponding to the target frequency f stored in step (6) to obtain loci of the vibration node lines and number of the vibration node lines, and storing values thereof;

(9) clamping the small work-piece: mounting the first L-shaped column and the second L-shaped column of the clamping device on the working platform of the high-frequency vibration energy amplification device via screws; clamping the small work-piece on the working platform via the clamping device, and arranging multiple cushion blocks between the working platform and the small work-piece, setting the cushion blocks along the vibration node lines on the small work-piece, with one cushion block for each vibration mode line; moving and mounting the pressing device along the horizontal and vertical directions of the adjusting beam so that the pressing device clamps the small work-piece on the working platform of the high-frequency vibration energy amplification device; moving and mounting the pressing blocks in the pressing device along the horizontal direction of the pressing beam so that the pressing blocks are located against both ends of the vibration node lines on the small work-piece;

(10) attaching strain gauges: attaching the strain gauges according to the distribution region of the peak residual stress on the small work-piece, the direction of the first principal stress and the direction of the second principal stress stored in step (4), attaching the strain gauges on the starting position of the distribution region of the peak residual stress, wherein the first strain gauge is attached along the direction of the first principal stress on the small work-piece and the second strain gauge is attached along the direction of the second principal stress on the small work-piece;

(11) connecting the strain gauges with a dynamic strain meter, connecting the dynamic strain meter with a host computer system, connecting the host computer system with a signal generator, connecting the signal generator with a power driver, and connecting the power driver with the electromagnetic exciter.

So far, the high-frequency vibratory stress relief device for eliminating residual stress of the small work-piece has been fabricated. The high-frequency vibratory stress relief device for eliminating the residual stress of the small work-piece comprises the high-frequency vibration energy amplification device, the clamping device, the cushion blocks, the strain gauges, the dynamic strain meter, the host computer system, the signal generator, the power driver, the electromagnetic exciter; the high-frequency vibration energy amplification device comprises the working platform, the cone-shaped connecting rod and the supporting platform; the small end of the cone-shaped connecting rod is connected with the surface center of the working platform, and the large end of the cone-shaped connecting rod is connected with the surface center of the supporting platform; the supporting platform of the high-frequency vibration energy amplification device is mounted on the vibration mesa of the moving part of the electromagnetic exciter; the clamping device comprises the adjusting device and the pressing device; the adjusting device comprises the adjusting beam, the first L-shaped column and the second L-shaped column; wherein the first L-shaped column and the second L-shaped column are symmetrical at two ends of the adjusting beam, with the two ends of the adjusting beam respectively on the top of the first L-shaped column and the top of the second L-shaped column; the pressing device comprises the stepped threaded rod, the pressing beam, two connecting threaded rod, two pressing blocks; the small diameter of the stepped threaded rod is mounted with the pressing beam; the connecting threaded rod is connected with each pressing block; each pressing block is mounted with the pressing beam; the large diameter of the stepped threaded rod is mounted with the adjusting beam; the first L-shaped column and the second L-shaped column of the clamping device are mounted on the working platform of the high-frequency vibration energy amplification device; the small work-piece is clamped on the working platform via the clamping device, and the cushion blocks are arranged between the working platform and the small work-piece, the strain gauges are attached on the starting position of the distribution region of the peak residual stress, the strain gauges are connected with the dynamic strain meter, the dynamic strain meter is connected with the host computer system, the host computer system is connected with the signal generator, the signal generator is connected with the power driver, and the power driver is connected with the electromagnetic exciter.

The finite element software is ANSYS finite element software.

The electromagnetic exciter is a high-frequency vibration exciter, which is employed to generate high-frequency vibration with the excitation frequency of greater than 1 kHz, and the maximum excitation frequency can reach 10 kHz.

The dynamic strain meter is a high precision, multi-channel strain meter displaying real-time strain waveform.

The strain gauges are attached at the staring position of the distribution region of the peak residual stress on the small work-piece, wherein the first strain gauge is attached along the direction of the first principal stress on the small work-piece, and the second strain gauge is attached along the direction of the second principal stress on the small work-piece. Under the action of the processing technology, the residual stress will be introduced on the surface of the small work-piece. The surface residual stress distribution on the small work-piece is obtained by means of X-ray diffraction (X-ray diffraction is a non-destructive residual stress testing method), thereby determining the distribution region of the peak residual stress. The distribution region of the peak residual stress is a region on the small work-piece prone to occurrence of microcracks and resulting damage in actual usage. Therefore, it is necessary to eliminate the peak residual stress on the small work-piece. The directions of the first principal stress and the second principal stress can be obtained via X-ray diffraction.

The cushion blocks are elastic cushion blocks, and the pressing blocks are elastic pressing blocks.

Number of the cushion blocks is equal to the number of the vibration node lines, and the number of the pressing devices is equal to the number of the vibration node lines.

Process of the high-frequency vibratory stress relief treatment employing the afore-mentioned high-frequency vibratory stress relief device for eliminating residual stress of the small work-piece is as follows: switching on the power of the host computer system, the dynamic strain meter, the signal generator, the power driver and the electromagnetic exciter; the host computer system controlling the signal generator to output a sinusoidal excitation signal which is independently and continuously adjustable in amplitude and frequency; the sinusoidal excitation signal is inputted to the electromagnetic exciter via the power driver; the host computer system controls the signal generator to output the frequency of the high-frequency vibratory stress relief, which is the target frequency f of the high-frequency vibration energy amplification device; adjusting the gain knob of the power driver slowly until the power driver outputs a constant current; driving the electromagnetic exciter to generate high-frequency vibration, and performing the high-frequency vibratory stress relief on the small work-piece via the high-frequency vibration energy amplification device; the strain waveform acquisition module in the host computer system obtaining the strain waveform on the small work-piece collected via the dynamic strain meter; the peak strain extraction module in the host computer system extracting the peak strain of the strain waveform, and the dynamic stress conversion module in the host computer system converting the peak strain s into the dynamic stress σ acting on the small work-piece, the relationship of conversion being $\sigma=E\varepsilon$, wherein E being an elastic modulus of the small work-piece.

The dynamic stress satisfies the following condition $\sigma_s<\sigma+\sigma_r<\sigma_p$, wherein $\sigma_s$ being the yield limit on the small work-piece, $\sigma_p$ being the fatigue limit of the small work-piece, and $\sigma_r$ being the peak residual stress on the small work-piece.

Specifically, the small work-piece is mounted on the working platform via the clamping device, and the high-frequency vibratory stress relief treatment on the small work-piece is carried out at the natural frequency of the first order axial vibration of the high-frequency vibration energy amplification device. The dynamic strain signal on the small work-piece is collected via the dynamic strain meter, and the peak strain acting on the small work-piece is converted into the dynamic stress acting on the small work-piece. Then the output current of the power driver is adjusted according to the relationship of the dynamic stress $\sigma_s<\sigma+\sigma_r<\sigma_p$ in order to ensure that the dynamic stress acting on the small work-piece can meet the experimental requirements of high-frequency vibratory stress relief. When the high-frequency vibratory stress relief is conducted at the natural frequency of the first order axial vibration of the high-frequency vibration energy amplification device, the high-frequency vibration energy amplification device can output the larger vibration energy. As a result, the elimination effect of residual stress on the small work-piece via the high-frequency vibratory stress relief can be improved.

The beneficial effects of the present invention are as follows:

1. By performing the high-frequency vibratory stress relief on the small work-piece under the natural frequency of the first order axial vibration of the high-frequency vibration energy amplification device, the output vibration energy of the electromagnetic exciter can be amplified. As a result, the vibration energy acting on the small work-piece is improved and the elimination effect of residual stress on the small work-piece via the high-frequency vibratory stress relief can be improved.
2. The strain gauges are attached on the distribution region of the first principal stress and the second principal stress of the peak residual stress on the small work-piece, which can directly determine the required external vibration stress for the high-frequency vibratory stress relief. As a result, the residual stress can be effectively eliminated via the high-frequency vibratory stress relief.
3. The sweeping frequency method is not employed to determine the excitation frequency of the high-frequency vibratory stress relief in the present invention. A novel determining method of the excitation frequency of the high-frequency vibratory stress relief is proposed in the present invention. As a result, the efficiency of the high-frequency vibratory stress relief can be improved.
4. The clamping device of the small work-piece has the advantages of simple structure, simple operation and convenient for the installation and adjustment for the operator.
5. The bending vibration of the small work-piece can be excited when the high-frequency vibratory stress relief treatment on the small work-piece is conducted under the natural frequency of the first order axial vibration of the high-frequency vibration energy amplification device; the elastic cushion blocks are employed to support the small work-piece at the vibration node lines, and the clamping devices are employed to clamp the small work-piece on the working platform of the high-frequency vibration energy amplification device against the vibration node lines on the small work-piece, so that the small work-piece can vibrate according to its mode shape. At this time, the output strain waveform on the small work-piece has a large peak strain. It implies that the dynamic stress acting on the small work-piece is larger. Therefore the elimination effect of residual stress on the small work-piece via the high-frequency vibratory stress relief can be improved.
6. The high-frequency vibration energy amplification device with the cone-shaped connecting rod is employed as the basic component of the high-frequency vibratory stress relief device. Compared with the high-frequency vibration energy amplification device with a cylindrical connecting rod, the cone shaped connecting rod adopted in the present invention has a lighter weight if the diameter of the large end of the cone shaped connecting rod is the same as the diameter of the cylindrical connecting rod, benefiting excitation of the high-frequency vibratory stress relief system. Since the driving capacity of the electromagnetic exciter is limited, additional weight of the high-frequency vibration energy amplification device is greater, is a burden for the high-frequency vibratory stress relief device to generate high-frequency vibration. Compared with the high-frequency vibration energy amplification device with the stepped cylindrical connecting rod, the cone shaped connecting rod adopted in the invention can reduce the stress concentration, which is beneficial to improve the service life of the high-frequency vibration energy amplification device. This is because the stepped cylindrical connecting rod tends to produce stress concentration in the transition area, which will reduce the service life of the high-frequency vibration energy amplification device.

EMBODIMENTS

Figure 1:
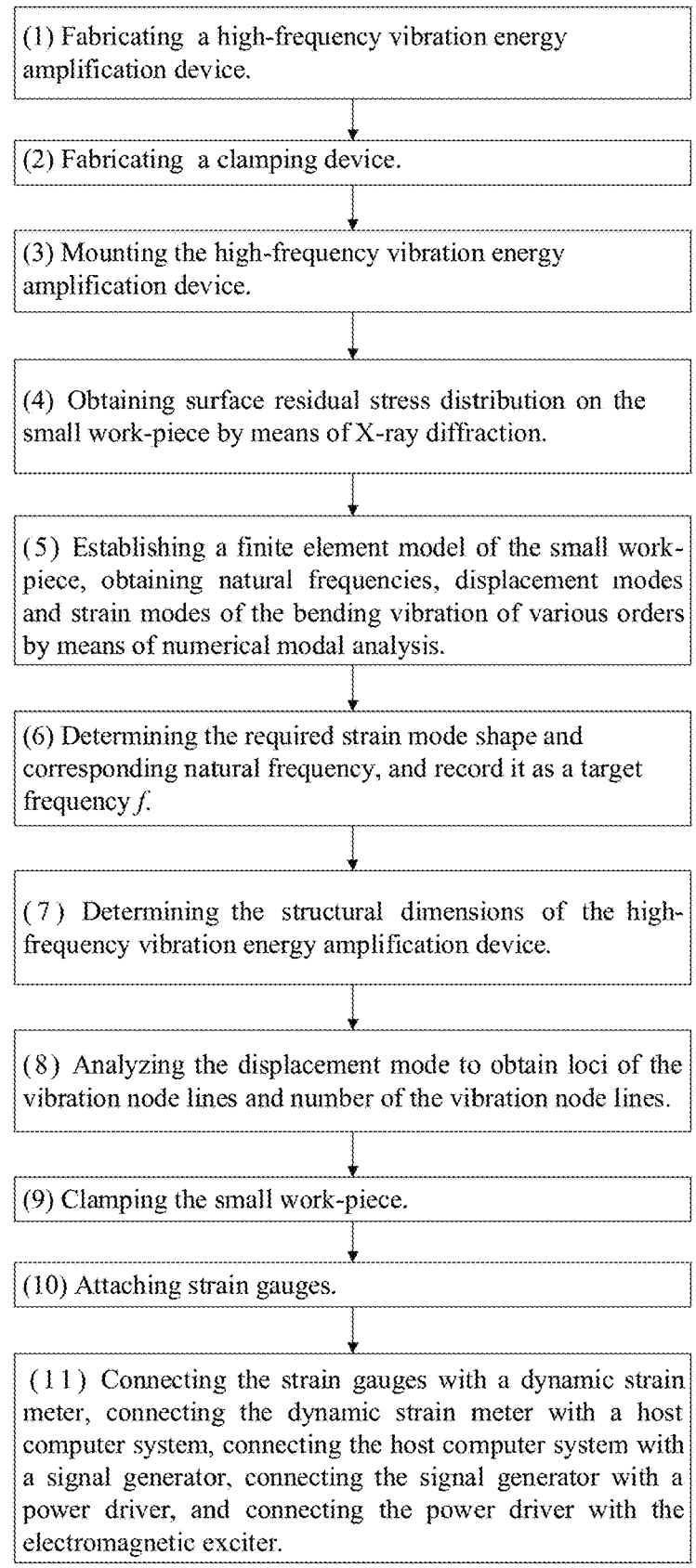
FIG. 1 is a flow chart of the constructing method of the high-frequency vibratory stress relief device for eliminating residual stress of a small work-piece of the present invention.
Figure 3:
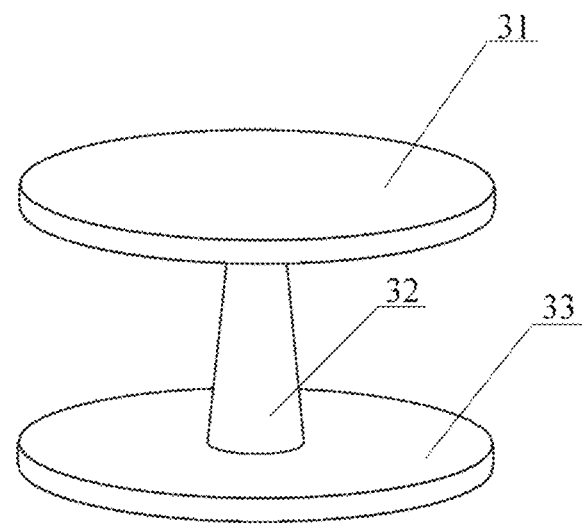
FIG. 3 is a schematic diagram of the high-frequency vibration energy amplification device of the present invention.
Figure 4:
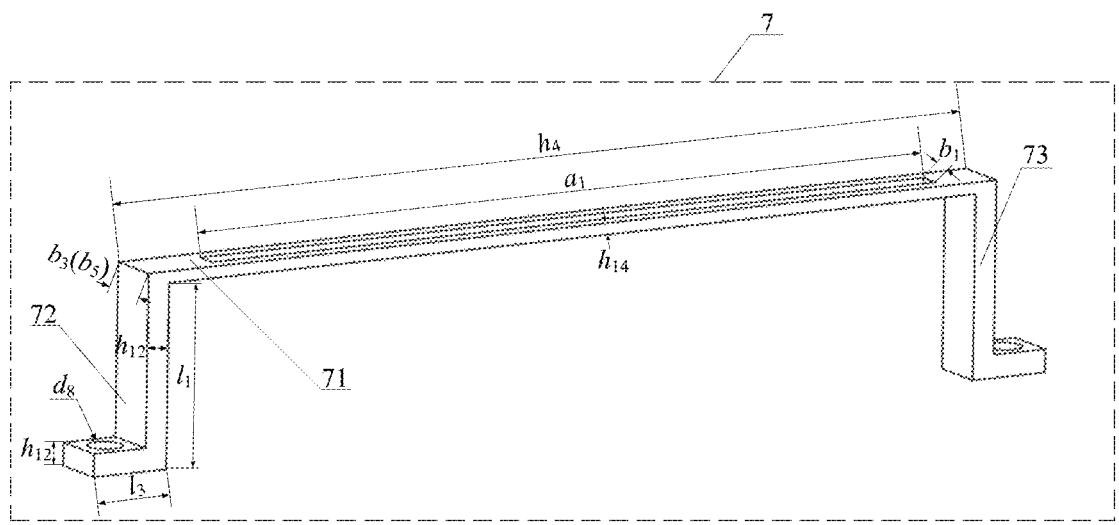
FIG. 4 is a schematic diagram of the adjusting device of the clamping device of the high-frequency vibratory stress relief device of the present invention.
Figure 5:
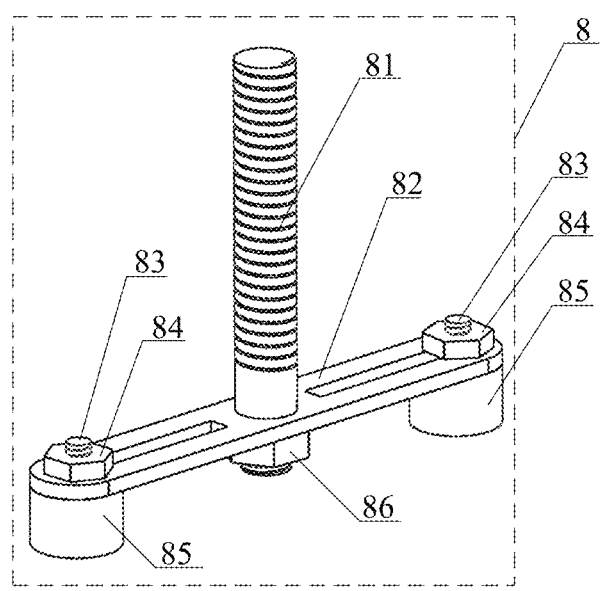
FIG. 5 is a schematic diagram of the pressing device of the clamping device of the high-frequency vibratory stress relief device of the present invention.
Figure 6:
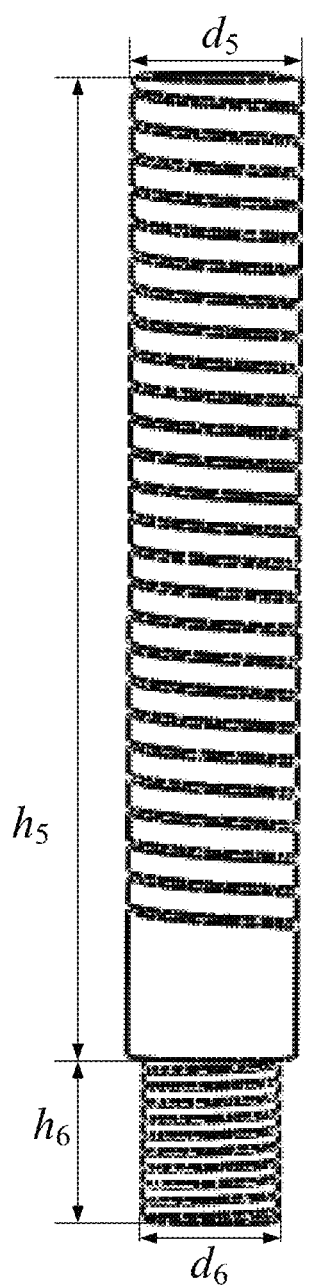
FIG. 6 is a schematic diagram of the stepped threaded rod of the clamping device of the high-frequency vibratory stress relief device of the present invention.
Figure 7:
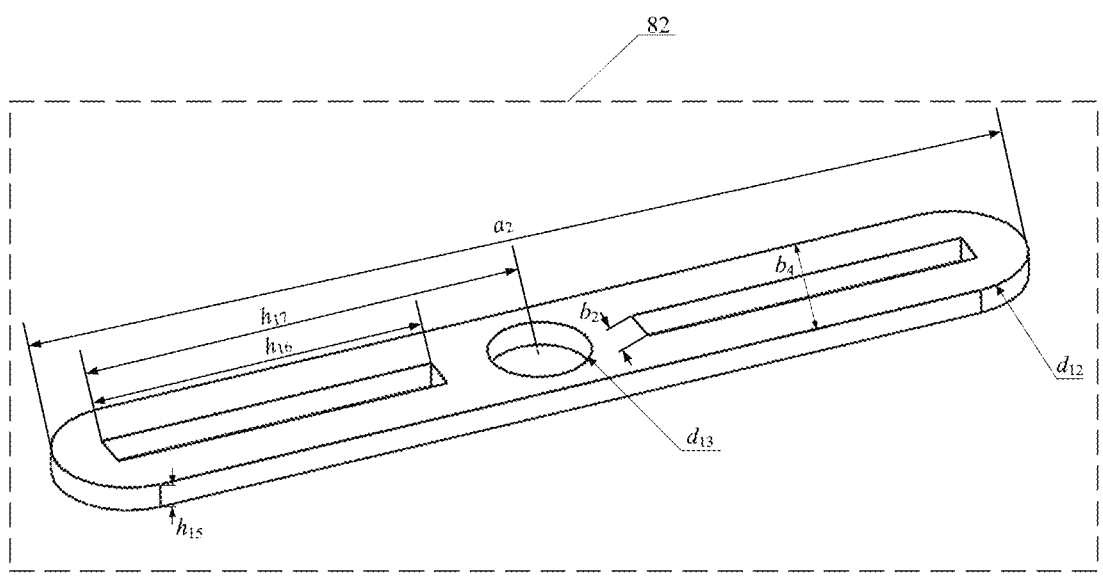
FIG. 7 is a schematic diagram of the pressing beam of the clamping device of the high-frequency vibratory stress relief device of the present invention.
Figure 8:
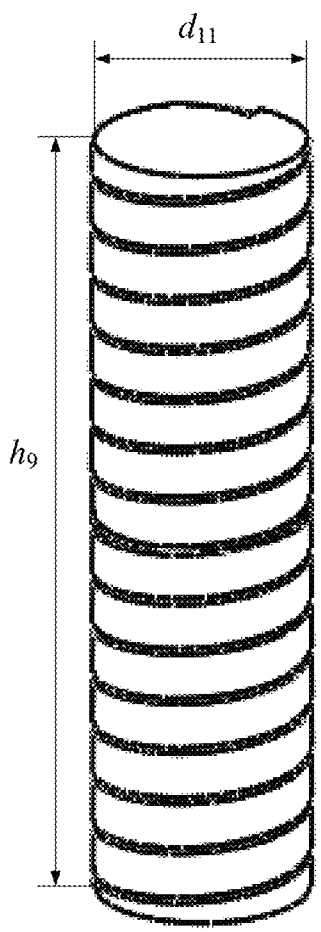
FIG. 8 is a schematic diagram of a connecting threaded rod of the clamping device of the high-frequency vibratory stress relief device of the present invention.
Figure 9:
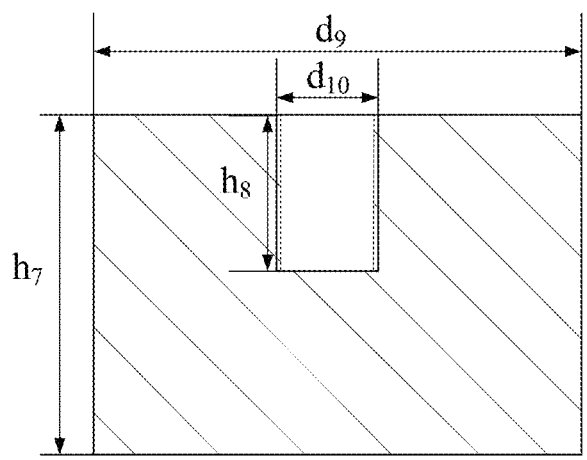
FIG. 9 is a section diagram of a pressing block of the clamping device of the high-frequency vibratory stress relief device of the present invention.
Figure 10:
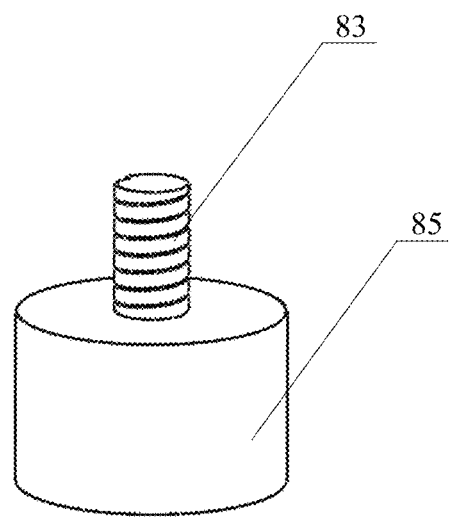
FIG. 10 is a schematic diagram of a connected threaded rod and a pressing block connection.
Figure 11:
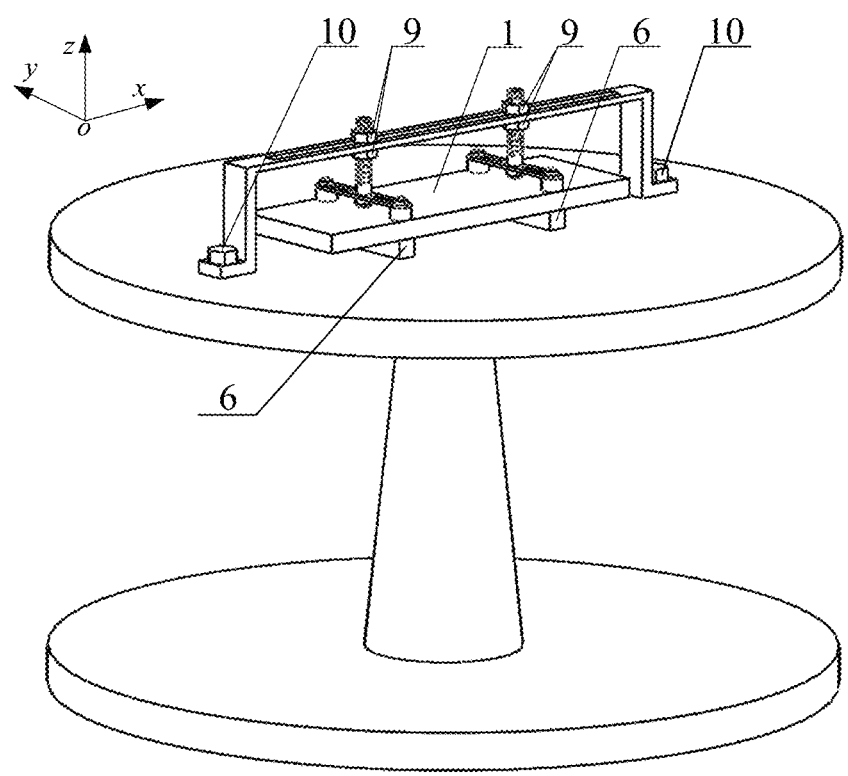
FIG. 11 is an assemble schematic diagram of the clamping device mounted on the high-frequency vibration energy amplification device of the present invention.

The present invention will be further described with reference to the accompanying drawings:

As shown in FIG. 1, the method of constructing a high-frequency vibratory stress relief device for eliminating residual stress of a small work-piece, the small work-piece having a length a, a width b and a thickness c, comprising the following steps:

(1) fabricating a high-frequency vibration energy amplification device 3: fabricating the high-frequency vibration energy amplification device 3 by means of integrated molding, wherein the upper part thereof is a working platform 31 in a shape of a cylinder, the middle part is a cone-shaped connecting rod 32, and the bottom part is a supporting platform 33 in a shape of a cylinder; the small end of the cone-shaped connecting rod 32 is connected with the surface center of the working platform 31, and the large end of the cone-shaped connecting rod 32 is connected with the surface center of the supporting platform 33; the high-frequency vibration energy amplification device 3 is shown in FIG. 3; determining structural dimensions $d_1$, $h_1$, $d_2$, $h_2$, $d_3$, $d_4$, and k of the high-frequency vibration energy amplification device 3 according to step (7), wherein $d_1$ is diameter and $h_1$ thickness of the working platform 31, $d_2$ is diameter and $h_2$ thickness of the supporting platform 33, $d_3$ is diameter of the small end of the cone-shaped connecting rod 32, $d_4$ is diameter of the large end of the cone-shaped connecting rod 32 and $h_3$ length of the cone-shaped connecting rod 32, under restrictions: $d_1=3\sim8b$, $h_1=2\sim6c$, $d_2=3\sim8b$, $h_2=2\sim6c$, $d_3=2\sim6c$, $d_4=2\sim6c$, $h_3=1\sim6b$, $d_1>d_3$, $d_2>d_4$, $h_3>h_1$, $h_3>h_2$;

(2) fabricating a clamping device 100: fabricating an adjusting device 7 by integrated molding, wherein a first L-shaped column 72 and a second L-shaped column 73 are symmetrical at two ends of an adjusting beam 71, with the two ends of the adjusting beam 71 respectively on the top of the first L-shaped column 72 and the top of the second L-shaped column 73; machining a rectangular chute on the adjusting beam 71, and machining a through hole each at the bottom part of the first L-shaped column 72 and a bottom part of the second L-shaped column 73; the adjusting device 7 is shown in FIG. 4; with $l_1$ denoting the height of the first L-shaped column 72, which is equal to the height of the second L-shaped column 73, $b_5$ denoting the width of the first L-shaped column 72, which is equal to the width of the second L-shaped column 73, $h_{12}$ denoting the thickness of the first L-shaped column 72, which is equal to the thickness of the second L-shaped column 73, $l_3$ denoting the length of the bottom part of the first L-shaped column 72, which is equal to the length of the bottom part of the second L-shaped column 73, $d_8$ denoting the diameter of the through hole of the first L-shaped column 72, which is equal to the diameter of the through hole of the second L-shaped column 73, $h_4$ denoting the length of the adjusting beam 71, $b_3$ denoting the width of the adjusting beam 71, $h_{14}$ denoting the thickness of the adjusting beam 71, $a_1$ denoting the length of the rectangular chute of the adjusting beam 71, $b_1$ denoting the width of the rectangular chute. The interrelations there among are: $l_1=10\sim15c$, $b_5=0.5h_1$, $h_{12}=0.2h_1$, $l_3=0.5\sim1h_1$, $d_8=0.4l_3$, $h_4=1.2\sim2a$, $b_3=b_5$, $h_{14}=0.5\sim1h_{12}$, $a_1>a$, $b_1=0.5b_3$. Then fabricating a pressing device 8: machining external thread on both sides of a stepped threaded rod 81, as shown in FIG. 6; machining a pressing beam 82 with a cuboid in the middle thereof and a half cylinder at both ends, as shown in FIG. 7; machining a through hole on the center of the pressing beam 82; passing the small diameter of the stepped threaded rod 81 through the through hole on the center of the pressing beam 82, and mounting the stepped threaded rod 81 with the pressing beam 82 via a nut 86; machining a rectangular chute on each side of the pressing beam 82; machining two pressing blocks 85 to be in shape of a cylinder, and machining a threaded hole on the center surface of each pressing block 85, as shown in FIG. 9; screwing a connecting threaded rod 83 having external threads through the threaded hole respectively in each pressing block 85; the connecting threaded rod 83 is shown in FIG. 8; passing each connecting threaded rod 83 through each rectangular chute on the pressing beam 82, as shown in FIG. 10; and mounting each pressing block 85 with the pressing beam 82 via a nut 84; with $d_5$ denoting the diameter and $h_5$ the length of a large diameter of the stepped threaded rod 81, $d_6$ denoting the diameter and $h_6$ the length of a small diameter of the stepped threaded rod 81, $a_2$ denoting the length, $b_4$ the width and $h_{15}$ denoting the thickness of the pressing beam 82, $d_{12}$ denoting the diameter of the half cylinder at both ends of the pressing beam 82, $d_{13}$ denoting the diameter of the through hole in the center of the pressing beam 82, $h_{16}$ denoting the length and $b_2$ the width of each rectangular chute of the pressing beam 82, $h_{17}$ denoting the farthest distance of each rectangular chute of the pressing beam 82 from the center of the through hole in the center of the pressing beam 82, $d_9$ denoting the diameter and $h_7$ the thickness of each pressing block 85, $d_{10}$ denoting the diameter and $h_8$ the depth of each threaded hole on the center surface of each pressing block 85, $d_{11}$ denoting the diameter and $h_9$ the length of each connecting threaded rod 83, inter-relations there among are: $d_5=0.9\sim 1 b_3$, $h_5=1\sim1.2l_1$, $d_6=0.5\sim0.8d_5$, $h_6=0.1\sim0.2h_5$, $a_2>b$, $b_4=0.05\sim0.1a$, $h_{15}=0.5h_6$, $d_{12}=b_4$, $d_6<d_{13}<d_5$, $h_{16}<0.5a_2$, $b_2=0.3\sim0.5b_4$, $0.5b\text{-}0.5d_9<h_{17}<0.5a_2$, $d_9=b_4$, $h_7=h_6$, $d_{10}=0.9\sim 1 b_2$, $h_8=0.5h_7$, $d_{11}=d_{10}$, $h_9=h_7$; passing the large diameter of the stepped threaded rod 81 of the pressing device 8 through the rectangular chute on the adjusting beam 71 of the adjusting device 7, and mounting the stepped threaded rod 81 with the adjusting beam 71 via two nuts 9, one there-beneath and one there-above, thus forming the clamping device 100;

(3) mounting the high-frequency vibration energy amplification device 3: mounting the supporting platform 33 of the high-frequency vibration energy amplification device 3 on a vibration mesa 5 of the moving part 4 of an electromagnetic exciter 101 via screws 20;

(4) obtaining surface residual stress distribution on the small work-piece 1 by means of X-ray diffraction, determining the distribution region of peak residual stress on the small work-piece 1, the direction of the first principal stress and the direction of the second principal stress, and storing the distribution region of the peak residual stress, the direction of the first principal stress and the direction of the second principal stress;

(5) employing a finite element software to establish a finite element model of the small work-piece 1, performing numerical modal analysis for the small work-piece 1 to obtain natural frequencies of bending vibration of various orders of the small work-piece 1, displacement modes and strain modes of the bending vibration of various orders corresponding to the natural frequencies, and storing the natural frequencies, the displacement modes and the strain modes of the bending vibration of the various orders of the small work-piece 1;

(6) determining the distribution region of peak strain on each strain mode of the bending vibration according to the strain modes of the bending vibration of various orders stored in step (5), and storing the distribution region of the peak strain for each order; recording the natural frequency corresponding to the strain mode wherein the distribution region of the peak strain of the strain mode is consistent with the distribution region of the peak residual stress on the small work-piece 1, and with a criterion as follows:

$$\frac{|X_r - X_\varepsilon|}{X_r} \times 100\% \leq 5\%,$$

wherein $X_r$ denoting the coordinate of the starting position of the distribution region of the peak residual stress in the x-axis direction on the small work-piece 1, $X_\varepsilon$ denoting the coordinate of the starting position of the distribution region of the peak strain in the x-axis direction on the small work-piece 1; denoting the natural frequency as a target frequency f for determining the structural dimensions of the high-frequency vibration energy amplification device 3;

(7) determining the structural dimensions $d_1$, $h_1$, $d_2$, $h_2$, $d_3$, $d_4$, and $h_3$ of the high-frequency vibration energy amplification device 3 with the following steps:

1) obtaining the minimum value and a maximum value for each of the structural dimensions $d_1$, $h_1$, $d_2$, $h_2$, $d_3$, $d_4$, and $h_3$; divide the length with the starting point of the minimum value and the ending point of the maximum value for each structural dimension into N segments to obtain N+1 values of each parameter, wherein N is an integer between 3 and 60; formulating $(N+1)^7$ 7-tupples $(p_1, p_2, p_3, p_4, p_5, p_6, p_7)$ as schemes for finite element model for the high-frequency vibration energy amplification device 3, wherein $p_i$ is one of the N+1 values of each respective structural dimension, i=1, . . . , 7;

2) performing numerical modal analysis for each scheme in step 1), and calculating $$\text{delta} = \frac{|f_a - f|}{f} \times 100\%;$$

selecting the scheme corresponding to the minimum value of the delta as the structural dimension scheme of the high-frequency vibration energy amplification device 3; $f_a$ denoting the natural frequency of the first order axial vibration of the high-frequency vibration energy amplification device 3;

(8) analyzing the displacement mode corresponding to the target frequency f stored in step (6) to obtain loci of the vibration node lines and number of the vibration node lines, and storing values thereof;

(9) clamping the small work-piece 1: mounting the first L-shaped column 72 and the second L-shaped column 73 of the clamping device 100 on the working platform 31 of the high-frequency vibration energy amplification device 3 via screws 10; clamping the small work-piece 1 on the working platform 31 via the clamping device 100, and arranging cushion blocks 6 between the working platform 31 and the small work-piece 1, setting the cushion blocks 6 along the vibration node lines on the small work-piece 1, with one cushion block for each vibration mode line; moving and mounting the pressing device 8 along the horizontal and vertical directions of the adjusting beam 71 so that the pressing device 8 clamps the small work-piece 1 on the working platform 31 of the high-frequency vibration energy amplification device 3; moving and mounting the pressing blocks 85 in the pressing device 8 along the horizontal direction of the pressing beam 82 so that the pressing blocks 85 are located against both ends of the vibration node lines on the small work-piece 1, as shown in FIG. 11;

(10) attaching strain gauges: attaching the strain gauges according to the distribution region of the peak residual stress on the small work-piece 1, the direction of the first principal stress and the direction of the second principal stress stored in step (4), attaching the strain gauges on the starting position of the distribution region of the peak residual stress, wherein the first strain gauge 21 is attached along the direction of the first principal stress on the small work-piece 1 and the second strain gauge 22 is attached along the direction of the second principal stress on the small work-piece 1;

(11) connecting the strain gauges with a dynamic strain meter 105, connecting the dynamic strain meter 105 with a host computer system 104, connecting the host computer system 104 with a signal generator 103, connecting the signal generator 103 with a power driver 102, and connecting the power driver 102 with the electromagnetic exciter 101.

Figure 2:
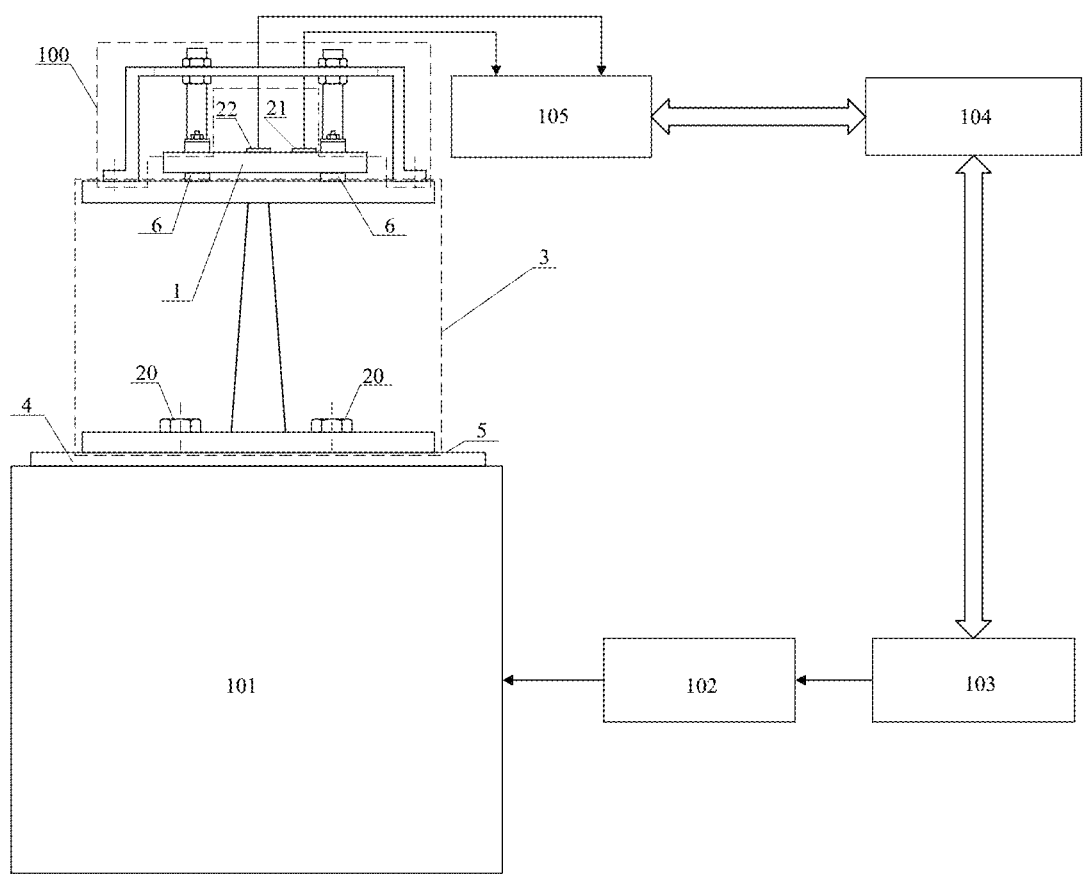
FIG. 2 is a schematic diagram of the high-frequency vibratory stress relief device of the present invention for eliminating residual stress of the small work-piece.

So far, the high-frequency vibratory stress relief device for eliminating residual stress of the small work-piece 1 has been fabricated, as shown in FIG. 2. The high-frequency vibratory stress relief device for eliminating residual stress of the small work-piece 1 comprises the high-frequency vibration energy amplification device 3, the clamping device 100, the cushion blocks 6, the first strain gauge 21 and the second strain gauge 22, the dynamic strain meter 105, the host computer system 104, the signal generator 103, the power driver 102, the electromagnetic exciter 101; the high-frequency vibration energy amplification device 3 comprises the working platform 31, the cone-shaped connecting rod 32 and the supporting platform 33, the small end of the cone-shaped connecting rod 32 is connected with the surface center of the working platform 31, and the large end of the cone-shaped connecting rod 32 is connected with the surface center of the supporting platform 33; the supporting platform 33 of the high-frequency vibration energy amplification device 3 is mounted on the vibration mesa 5 of the moving part 4 of the electromagnetic exciter 101; the clamping device 100 comprises the adjusting device 7 and the pressing device 8; the adjusting device 7 comprises the adjusting beam 71, the first L-shaped column 72 and the second L-shaped column 73; wherein the first L-shaped column 72 and the second L-shaped column 73 are symmetrical at two ends of the adjusting beam 71, with the two ends of the adjusting beam 71 respectively on the top of the first L-shaped column 72 and the top of the second L-shaped column 73; the pressing device 8 comprises the stepped threaded rod 81, the pressing beam 82, two connecting threaded rod 83, two pressing blocks 85; the small diameter of the stepped threaded rod 81 is mounted with the pressing beam 82; the connecting threaded rod is connected with each pressing block 85; each pressing block 85 is mounted with the pressing beam 82; the large diameter of the stepped threaded rod 81 are mounted with the adjusting beam 71; the first L-shaped column 72 and the second L-shaped column 73 of the clamping device 100 are mounted on the working platform 31 of the high-frequency vibration energy amplification device 3; the small work-piece 1 is clamped on the working platform 31 via the clamping device 100, and the cushion blocks 6 are arranged between the working platform 31 and the small work-piece 1; the first strain gauge 21 and the second strain gauge 22 are attached on the starting position of the distribution region of the peak residual stress, the first strain gauge 21 and the second strain gauge 22 are connected with the dynamic strain meter 105, the dynamic strain meter 105 is connected with the host computer system 104, the host computer system 104 is connected with the signal generator 103, the signal generator 103 is connected with the power driver 102, and the power driver 102 is connected with the electromagnetic exciter 101.

The finite element software is ANSYS finite element software.

The electromagnetic exciter 101 is a high-frequency vibration exciter, which is employed to generate high-frequency vibration with the excitation frequency of greater than 1 kHz, and the maximum excitation frequency can reach 10 kHz.

The dynamic strain meter 105 is a high precision, multi-channel strain meter displaying real-time strain waveform.

The cushion blocks 6 are elastic cushion blocks, and the pressing blocks 85 are elastic pressing blocks.

The number of the cushion blocks 6 is equal to the number of the vibration node lines, and the number of the pressing devices 8 is equal to the number of the vibration node lines.

The process of the high-frequency vibratory stress relief is as follows: switching on the power of the host computer system 104, the dynamic strain meter 105, the signal generator 103, the power driver 102 and the electromagnetic exciter 101; the host computer system 104 controlling the signal generator 103 to output a sinusoidal excitation signal which is independently and continuously adjustable in amplitude and frequency; the sinusoidal excitation signal is inputted to the electromagnetic exciter 101 via the power driver 102; the host computer system 104 controls the signal generator 103 to output the frequency of the high-frequency vibratory stress relief, which is the target frequency f of the high-frequency vibration energy amplification device 3; adjusting the gain knob of the power driver 102 slowly until the power driver 102 outputs a constant current; driving the electromagnetic exciter 101 to generate high-frequency vibration, and performing the high-frequency vibratory stress relief on the small work-piece 1 via the high-frequency vibration energy amplification device 3; the strain waveform acquisition module in the host computer system 104 obtaining the strain waveform of the small work-piece 1 collected by the dynamic strain meter 105; the peak strain extraction module in the host computer system 104 extracting the peak strain of the strain waveform, and the dynamic stress conversion module in the host computer system 104 converting the peak strain s into the dynamic stress σ acting on the small work-piece 1, the relationship of conversion being σ=Eε, wherein E being an elastic modulus of the small work-piece 1.

Figure 16:
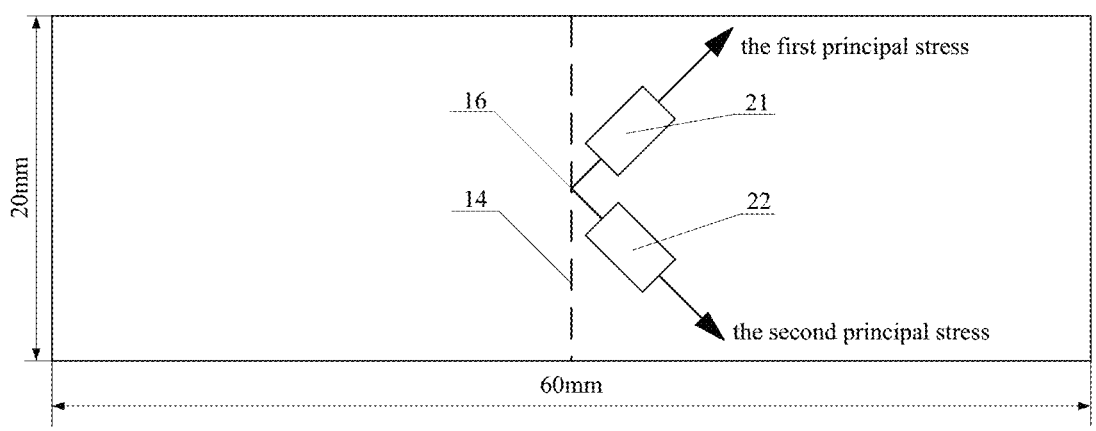
FIG. 16 is a schematic diagram showing strain gauges attaching for the constructing method of the high-frequency vibratory stress relief device for eliminating residual stress of the small work-piece of the present invention.

The dynamic stress satisfies the following condition $\sigma_s < \sigma + \sigma_r < \sigma_p$, wherein $\sigma_s$ being the yield limit of the small work-piece 1, $\sigma_p$ being the fatigue limit of the small work-piece 1, and $\sigma_r$ being the peak residual stress on the small work-piece 1, and $\sigma_r$ being the peak residual stress on the small work-piece 1. The details are as follows: the first strain gauge 21 is attached along the direction of the first principal stress on the small work-piece 1, the second strain gauge 22 is attached along the direction of the second principal stress on the small work-piece 1, as shown in FIG. 16. In the process of high-frequency vibratory stress relief, the peak strain collected by the first strain gauge 21 is $\varepsilon_1$, and the corresponding dynamic stress acting on the direction of the first principal stress is $\sigma_1 = E\varepsilon_1$; the peak strain collected by the second strain gauge 22 is $\varepsilon_2$, and the corresponding dynamic stress acting on the direction of the second principal stress is $\sigma_2 = E\varepsilon_2$. The first principal stress $\sigma_{r1}$ and the second principal stress $\sigma_{r2}$ can be obtained by means of X-ray diffraction. The method of obtaining peak residual stress of the small work-piece 1 by means of X-ray diffraction is based on the ASTM E915-2010 "Standard test method for verifying the alignment of X-Ray diffraction instrumentation for residual stress measurement". In the process of the high-frequency vibratory stress relief, by adjusting the output current of the power driver 102, the high-frequency vibration energy output by the electromagnetic exciter 101 is adjusted. So that the sum of $\sigma_1$ and $\sigma_{r1}$ and the sum of $\sigma_2$ and $\sigma_{r2}$ meet the relationship $\sigma_s<\sigma+\sigma_r<\sigma_p$, namely $\sigma_s<\sigma_1+\sigma_{r1}<\sigma_p$ and $\sigma_s<\sigma_2+\sigma_{r2}<\sigma_p$. Thus, the residual stress can be eliminated by the high-frequency vibratory stress relief.

Figure 12:
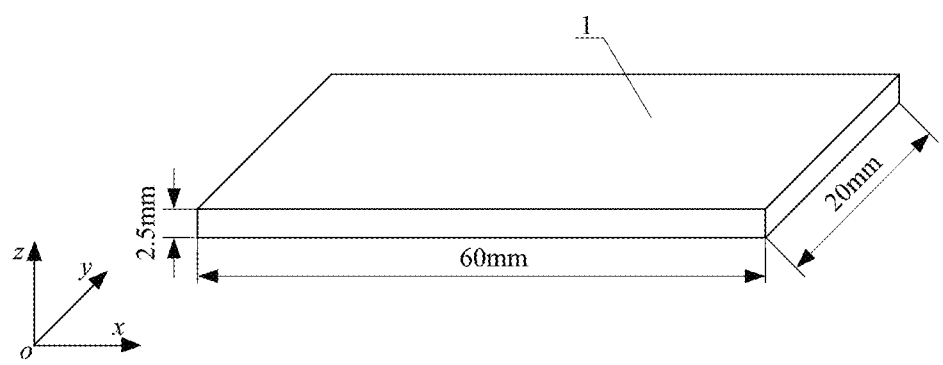
FIG. 12 is a schematic diagram of the small work-piece.
Figure 13:
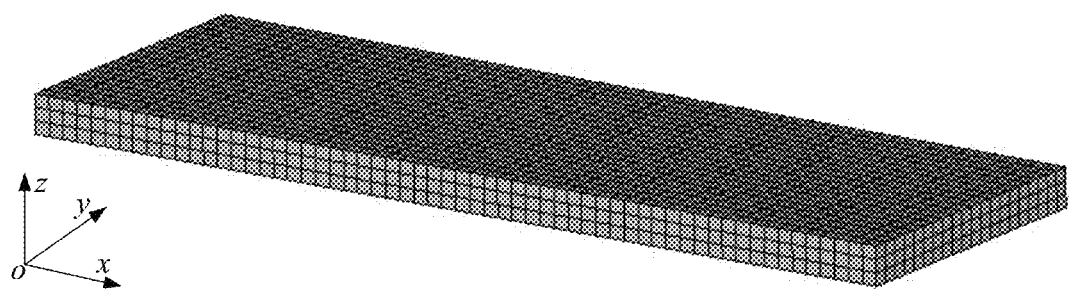
FIG. 13 is a schematic diagram of meshing of the small work-piece.
Figure 14:
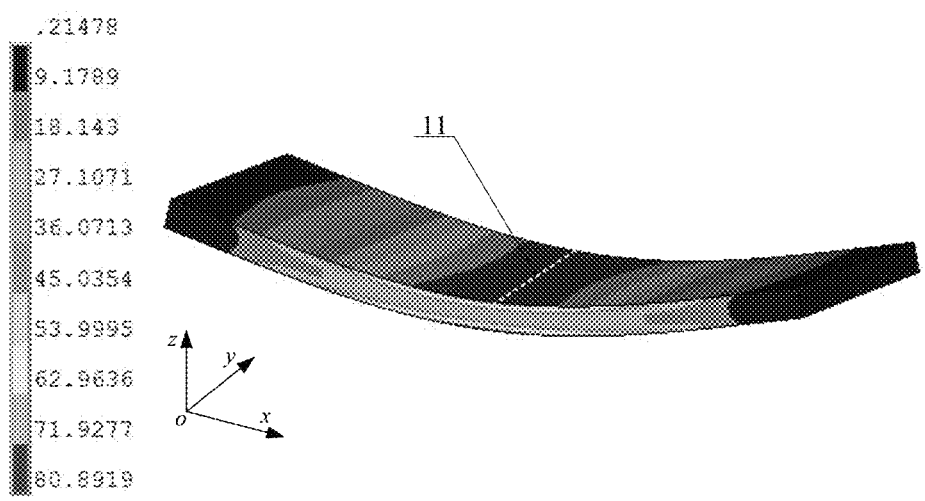
FIG. 14 is a schematic diagram of the first order bending vibration strain mode of the small work-piece of the present invention.
Figure 15:
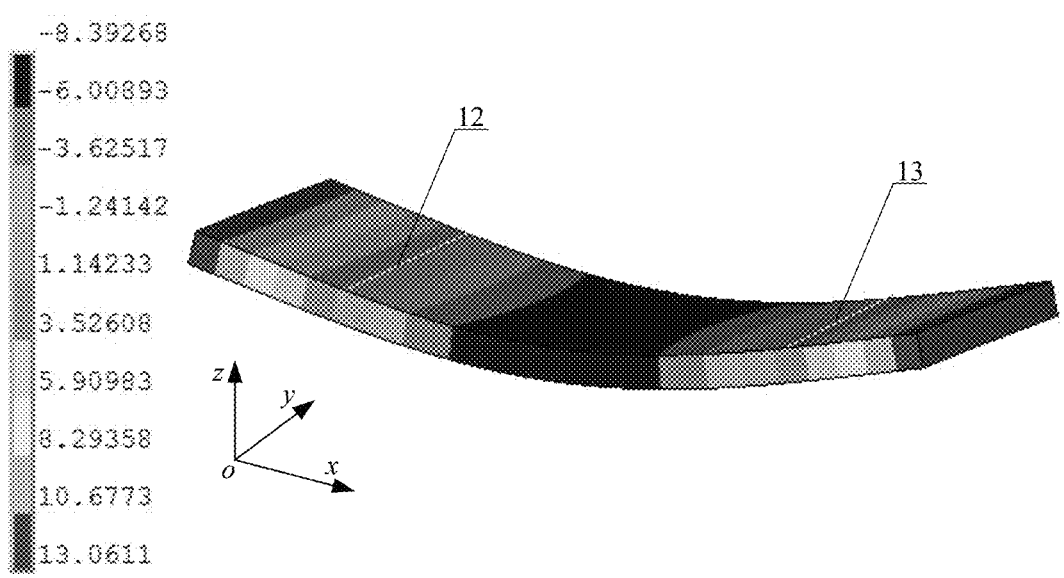
FIG. 15 is a schematic diagram of the first order bending vibration displacement mode of the small work-piece of the present invention.
Figure 17:
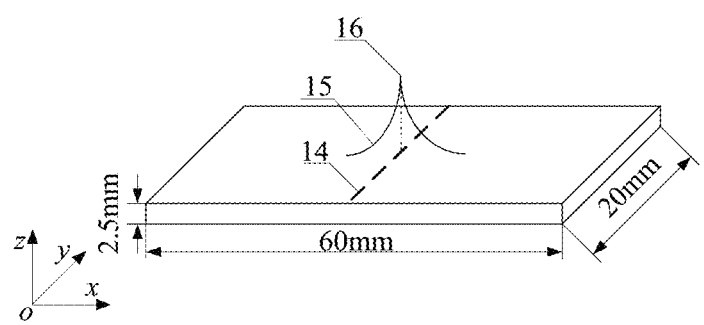
FIG. 17 is a schematic diagram of surface residual stress distribution on the small work-piece for the constructing method of the high-frequency vibratory stress relief device for eliminating residual stress of the small work-piece of the present invention.

As an embodiment, the steps of the numerical modal analysis for the small work-piece 1 are as follows:

The small work-piece 1 for numerical modal analysis is a 45 # steel plate small work-piece 1 with a length of 60 mm, a width of 20 mm and a thickness of 2.5 mm, as shown in FIG. 12. The high-frequency vibratory stress relief device constructed by the present invention can effectively carry out the high-frequency vibratory stress relief treatment on the small work-piece 1 whose natural frequency of the first order bending vibration reaches more than 1 kHz. For the numerical modal analysis, the density ρ, elastic modulus E and Poisson's ratio ν of 45 # steel are required. The specific values are ρ=7850 kg/m³, E=200 GPa, and ν=0.28, respectively. The process of the numerical modal analysis is as follows: the SOLID95 element is employed to mesh the small work-piece 1 in the Element Type sub module of the Preprocessor pre-processing module, and the material parameters, comprising density ρ, elastic modulus E and Poisson's ratio ν are given in the Material Props sub module of the Preprocessor pre-processing module. The three dimensional solid model of the small work-piece 1 is established in the Modeling sub module of the Preprocessor pre-processing module and meshed in the Meshing sub module of the Preprocessor pre-processing module. In order to improve the accuracy of the solution, the No. of element divisions is 60 in the length of the small work-piece 1, the No. of element divisions is 20 in the width of the small work-piece 1 and the No. of element divisions is 3 in the thickness of the small work-piece 1. The small work-piece 1 is meshed by the Mapped method and a regular mesh can be obtained. The meshing of the small work-piece 1 is shown in FIG. 13. The solution type is set as Modal in the Analysis Type sub module of the Solution module. The Mode extraction method is set as the Block Lanczos in the Analysis Type sub module of the Solution module. The No. of modes to extract is set as 30 and the No. of modes to expand is set as 30 in the Analysis Type sub module of the Solution module. The Calculate element results option in the Analysis Type sub module of the Solution module is checked. The Current LS button in the Solve sub module of the Solution module is clicked to conduct the numerical modal analysis of the small work-piece 1, and the modal analysis results can be obtained in the General Postproc reprocessing module. The first order bending vibration strain mode of the small work-piece 1 is shown in FIG. 14, and the natural frequency corresponding to the strain mode is 3592.4 Hz. The numerals 0.21478, 9.1789, 18.143, 27.1071, 36.0713, 45.0354, 53.9995, 62.9636, 71.9277 and 80.8919 shown on the bar in the left part of the FIG. 14 respectively represent the strains distributed on the small work-piece 1. The region corresponding to the position 11 of peak strain as represented by the coordinate $X_r$ along the x-axis corresponds to the strain 80.8919. The distribution region of the peak strain can be obtained according to the strain mode, and the position 11 of the peak strain, that is, the starting position of the distribution region of the peak strain in the x-axis can be defined by the coordinate $X_\varepsilon$ along the x-axis. Taking laser processing as an example, the laser surface processing is performed along the y-axis direction in FIG. 17. The laser surface processing path 14 is shown in FIG. 17, and the residual stress distribution curve 15 is shown in FIG. 17. The distribution region of the peak residual stress can be obtained, and the position 16 of the peak residual stress, that is, the starting position of the distribution region of peak residual stress in the x-axis direction can be defined by the coordinate $X_r$ along the x-axis. When $$\frac{|X_r - X_\varepsilon|}{X_r} \times 100\% \le 5\%,$$

it is defined that the peak strain distribution region is consistent with the peak residual stress distribution region, and the frequency corresponding to the strain mode is the target frequency f. The first order bending vibration displacement mode is shown in FIG. 15. The numerals −8.39268, −6.00893, −3.62517, −1.24142, 1.14233, 3.52608, 5.90983, 8.29358, 10.6773 and 13.0611 shown on the bar in the left part of the FIG. 15 respectively represent the displacements distributed on the small work-piece 1, and the unit is millimeter. As shown in FIG. 15, there are two vibration node lines 12 and 13 on the 45 # steel plate small work-piece 1 according to the displacement mode. Therefore, two cushion blocks 6 and two pressing devices 8 are arranged on the vibration node line 12 and vibration node line 13, respectively.

It is to be noted that positions other than the starting position of the distribution region of peak strain, so long as they characterize the distribution region of peak strain, may be chosen to represent the position 11 of peak strain. Examples are: ending position of the distribution region of peak strain, or mid-point of the distribution region of peak strain. The same applies for the position 16 of peak residual stress. That is, positions other than the starting position of the distribution region of peak residual stress, so long as they characterize the distribution region of peak residual stress, may be chosen to represent the position 16 of peak residual stress. Examples are: ending position of the distribution region of peak residual stress, or mid-point of the distribution region of peak residual stress.

The steps for determining the structural dimensions of the high-frequency vibration energy amplification device are as follows:

1) The ranges of structural dimensions are: $d_1$=3~8b, $h_1$=2~6c, $d_2$=3~8b, $h_2$=2~6c, $d_4$=2~6c, $d_4$=2~6c, $h_3$=1~6b, $d_1>d_3$, $d_2>d_4$, $h_3>h_1$, $h_3>h_2$; Setting N as 10 to obtain 11 values of each structural dimension. In order to reduce the number of schemes, three values are selected for the thickness $h_1$ of the working platform 31, the length $h_3$ of the cone-shaped connecting rod 32 and the diameter $d_3$ of the small end of the cone-shaped connecting rod 32, a value for each of 4 dimension parameters is selected respectively $d_1$=100 mm, $d_2$=100 mm, $h_2$=8 mm, $d_4$=11 mm; the three values of the length $h_3$ of the cone-shaped connecting rod 32 are respectively 40 mm, 50 mm and 60 mm; the three values of the diameter $d_3$ of the small end of the cone-shaped connecting rod 32 are respectively 8 mm, 9 mm and 10 mm; the values levels of the thickness $h_1$ of the working platform 31 are respectively 9 mm, 10 mm and 11 mm; as shown in Table 1; the selected schemes are shown in Table 2.

TABLE 1

Structural dimensions and values of structural dimensions

| values | structural dimensions | | |
|---|---|---|---|
| | $h_3$ (mm) | $d_3$ (mm) | $h_1$ (mm) |
| 1 | 40 | 8 | 9 |
| 2 | 50 | 9 | 10 |
| 3 | 60 | 10 | 11 |

TABLE 2

Selected schemes of structural dimensions of the high frequency vibration energy amplification device

| schemes | structural dimensions | | |
|---|---|---|---|
| | $h_3$ (mm) | $d_3$ (mm) | $h_1$ (mm) |
| 1 | 40 | 8 | 9 |
| 2 | 40 | 9 | 10 |
| 3 | 40 | 10 | 11 |
| 4 | 50 | 8 | 10 |
| 5 | 50 | 9 | 11 |
| 6 | 50 | 10 | 9 |
| 7 | 60 | 8 | 11 |
| 8 | 60 | 9 | 9 |
| 9 | 60 | 10 | 10 |

2) performing numerical modal analysis for each scheme in step 1), and calculating $$\text{delta} = \frac{|f_a - f|}{f} \times 100\%;$$

and the results are shown in Table 3; selecting the scheme corresponding to the minimum value of the delta as the structural dimension scheme of the high-frequency vibration energy amplification device 3; $f_a$ denoting the natural frequency of the first order axial vibration of the high-frequency vibration energy amplification device 3. According to the calculated results, it can be found that scheme 9 is the most suitable scheme. According to the above process, a scheme with the minimum value can be found.

TABLE 3

Results of each scheme

| schemes | structural dimensions | | | $f_a$(Hz) | $\frac{|f_a - f|}{f} \times 100\%$ |
|---|---|---|---|---|---|
| | $h_3$(mm) | $d_3$(mm) | $h_1$(mm) | | |
| 1 | 40 | 8 | 9 | 3449.2 | 3.98% |
| 2 | 40 | 9 | 10 | 3611.5 | 0.53% |
| 3 | 40 | 10 | 11 | 3717.1 | 3.47% |
| 4 | 50 | 8 | 10 | 3522.8 | 1.94% |
| 5 | 50 | 9 | 11 | 3636.1 | 1.22% |
| 6 | 50 | 10 | 9 | 3538.9 | 1.49% |
| 7 | 60 | 8 | 11 | 3549.3 | 1.20% |
| 8 | 60 | 9 | 9 | 3451.5 | 3.92% |
| 9 | 60 | 10 | 10 | 3599.4 | 0.19% |

The steps of the numerical modal analysis for the high-frequency vibration energy amplification device 3 are as follows:

The material of the high-frequency vibration energy amplification device 3 for numerical modal analysis is aluminium alloy. For the numerical modal analysis, the density ρ, elastic modulus E and Poisson's ratio ν of aluminium alloy are required. The specific values are ρ=2700 kg/m³, E=70 GPa, and ν=0.3, respectively. The process of the numerical modal analysis is as follows: the SOLID95 element is employed to mesh the high-frequency vibration energy amplification device 3 in the Element Type sub module of the Preprocessor pre-processing module, and the material parameters, comprising density ρ, elastic modulus E and Poisson's ratio ν are given in the Material Props sub module of the Preprocessor pre-processing module. The three dimensional solid model of the high-frequency vibration energy amplification device 3 is established in the Modeling sub module of the Preprocessor pre-processing module and meshed in the Mesh Tool sub module of the Preprocessor pre-processing module. The high-frequency vibration energy amplification device 3 is meshed by the Free method. In order to improve the accuracy of the solution, the precision is set to 3. The solution type is set as Modal in the Analysis Type sub module of the Solution module. The Mode extraction method is set as the Block Lanczos in the Analysis Type sub module of the Solution module. The No. of modes to extract is set as 20 and the No. of modes to expand is set as 20 in the Analysis Type sub module of the Solution module. The Current LS button in the Solve sub module of the Solution module is clicked to conduct the numerical modal analysis of the high-frequency vibration energy amplification device 3, and the modal analysis results can be obtained in the General Postproc reprocessing module.

The dimensions of the clamping device 100 in the embodiment are as follows: $l_1$=30 mm, $b_5$=5 mm, $h_{12}$=2 mm, $l_3$=5 mm, $d_8$=2 mm, $h_4$=80 mm, $b_3$=5 mm, $h_{14}$=1.5 mm, $a_1$=70 mm, $b_1$=2.5 mm, $d_5$=5 mm, $h_5$=30 mm, $d_6$=4 mm, $h_6$=3 mm, $a_2$=22 mm, $b_4$=5 mm, $h_{15}$=1.5 mm, $d_{12}$=5 mm, $d_{13}$=4.2 mm, $h_{16}$=6 mm, $b_2$=2 mm, $h_{17}$=8 mm, $d_9$=5 mm, $h_7$=3 mm, $d_{10}$=2 mm, $h_8$=1.5 mm, $d_{11}$=2 mm, $h_9$=3 mm.

Specifically, the small work-piece 1 is mounted on the working platform 31 by the clamping device 100, and the high-frequency vibratory stress relief treatment on the small work-piece 1 is carried out at the natural frequency of the first order axial vibration of the high-frequency vibration energy amplification device 3. The dynamic strain signal of the small work-piece 1 is collected by the dynamic strain meter 105, and the peak strain acting on the small work-piece 1 is converted into the dynamic stress acting on the small work-piece 1. Then the output current of the power driver 102 is adjusted according to the relationship of the dynamic stress $\sigma_s < \sigma + \sigma_r < \sigma_p$ in order to ensure that the dynamic stress acting on the small work-piece 1 can meet the experimental requirements of the high-frequency vibratory stress relief. When the high-frequency vibratory stress relief is conducted at the natural frequency of the first order axial vibration of the high-frequency vibration energy amplification device 3, the high-frequency vibration energy amplification device 3 can output the larger vibration energy. As a result, the elimination effect of residual stress of the small work-piece 1 by the high-frequency vibratory stress relief can be improved.

The content described in the embodiments of the present specification is merely an enumeration of the implementation forms of the inventive concept, and the scope of the present invention shall not be construed as being limited to the specific forms expressed in the embodiments. Equivalent technical means that a skilled person of the art may construct from the conception of the present invention shall fall under the scope of the present invention.

The invention claimed is:
1. A method of constructing a high-frequency vibratory stress relief device for eliminating residual stress of a small work-piece, the small work-piece having a length a, a width b and a thickness c, comprising the following steps:
  (1) fabricating a high-frequency vibration energy amplification device: fabricating the high-frequency vibration energy amplification device by means of integrated molding, wherein an upper part thereof is a working platform in a shape of a cylinder, a middle part is a cone-shaped connecting rod, and a bottom part is a supporting platform in a shape of a cylinder; a small end of the cone-shaped connecting rod is connected with a surface center of the working platform, and a large end of the cone-shaped connecting rod is connected with a surface center of the supporting platform; determining structural dimensions $d_1$, $h_1$, $d_2$, $h_2$, $d_3$, $d_4$, and $h_3$ of the high-frequency vibration energy amplification device according to step (7), wherein $d_1$ is diameter and $h_1$ thickness of the working platform, $d_2$ is diameter and $h_2$ thickness of the supporting platform, $d_3$ is diameter of the small end of the cone-shaped connecting rod, $d_4$ is diameter of the large end of the cone-shaped connecting rod and $h_3$ length of the cone-shaped connecting rod, under restrictions: $d_1=3\sim$, $h_1=2\sim$, $d_2=3\sim$, $h_2=2\sim$, $d_3=2\sim$, $d_4=2\sim$, $h_3=1\sim$, $d_1>d_3$, $d_2>d_4$, $h_3>h_1$, $h_3>h_2$;
  (2) fabricating a clamping device: fabricating an adjusting device by integrated molding, wherein a first L-shaped column and a second L-shaped column are symmetrical at two ends of an adjusting beam, with the two ends of the adjusting beam respectively on a top of the first L-shaped column and a top of the second L-shaped column; machining a rectangular chute on the adjusting beam, and machining a through hole each at a bottom part of the first L-shaped column and a bottom part of the second L-shaped column; with $l_1$ denoting height of the first L-shaped column, which is equal to height of the second L-shaped column, $b_5$ denoting width of the first L-shaped column, which is equal to width of the second L-shaped column, $h_{12}$ denoting thickness of the first L-shaped column, which is equal to thickness of the second L-shaped column, $l_3$ denoting length of the bottom part of the first L-shaped column, which is equal to length of the bottom part of the second L-shaped column, $d_8$ denoting diameter of the through hole of the first L-shaped column, which is equal to diameter of the through hole of the second L-shaped column, $h_4$ denoting length of the adjusting beam, $b_3$ denoting width of the adjusting beam, $h_{14}$ denoting thickness of the adjusting beam, $a_1$ denoting length of the rectangular chute of the adjusting beam, $b_1$ denoting width of the rectangular chute, relations there among are: $l_1=10\sim$, $b_5=0.5h_1$, $h_{12}=0.2h_1$, $l_3=0.5\sim$, $d_8=0.4\ l_3$, $h_4=1.2\sim$, $b_3=b_5$, $h_{14}=0.5\sim$, $a_1>a$, $b_1=0.5\ b_3$; then fabricating a pressing device: machining external thread on both sides of a stepped threaded rod; machining a pressing beam with a cuboid in a middle thereof and a half cylinder at both ends; machining a through hole on a center of the pressing beam; passing a small diameter of the stepped threaded rod through the through hole on the center of the pressing beam, and mounting the stepped threaded rod with the pressing beam via a nut; machining a rectangular chute on each side of the pressing beam; machining two pressing blocks to be in shape of a cylinder, and machining a threaded hole on a center surface of each pressing block, screwing a connecting threaded rod having external threads through the threaded hole respectively in each pressing block; passing each connecting threaded rod through each rectangular chute on the pressing beam, and mounting each pressing block with the pressing beam via a nut; with $d_5$ denoting diameter and $h_5$ length of a large diameter of the stepped threaded rod, $d_6$ denoting diameter and $h_6$ length of a small diameter of the stepped threaded rod, $a_2$ denoting length, $b_4$ denoting width and $h_{15}$ thickness of the pressing beam, $d_{12}$ denoting diameter of the half cylinder at each end of the pressing beam, $d_{13}$ denoting diameter of the through hole in the center of the pressing beam, $h_{16}$ denoting length and $b_2$ denoting width of each rectangular chute of the pressing beam, $h_{17}$ denoting farthest distance of each rectangular chute of the pressing beam from the center of the through hole in the center of the pressing beam, $d_9$ denoting diameter and $h_7$ denoting thickness of each pressing block, $d_0$ denoting diameter and $h_8$ denoting depth of each threaded hole on the center surface of each pressing block, $d_{11}$ denoting diameter and $h_9$ denoting length of each connecting threaded rod, inter-relations there among are: $d_5=0.9\sim$, $h_5=1\sim$, $d_6=0.5\sim$, $h_6=0.1\sim$, $a_2>b$, $b_4=0.05\sim$, $h_{15}=0.5h$, $d_{12}=b_4$, $d_6<d_{13}<d_5$, $h_{16}<0.5a_2$, $b_2=0.3\sim$, $0.5b-0.5d_9<h_{17}<0.5a_2$, $d_9=b_4$, $h_7=h_6$, $d_{10}=0.9\sim$, $h_8=0.5h_7$, $d_{11}=d_{10}$, $h_9=h_7$; passing a large diameter of the stepped threaded rod of the pressing device through the rectangular chute on the adjusting beam of the adjusting device, and mounting the stepped threaded rod with the adjusting beam via two nuts, one there-beneath and one there-above, thus forming the clamping device;
  (3) mounting the high-frequency vibration energy amplification device: mounting the supporting platform of the high-frequency vibration energy amplification device on a vibration mesa of a moving part of an electromagnetic exciter via screws;
  (4) obtaining surface residual stress distribution on the small work-piece by means of X-ray diffraction, determining a distribution region of peak residual stress on the small work-piece, direction of first principal stress and direction of second principal stress, and storing the distribution region of the peak residual stress, the direction of the first principal stress and the direction of the second principal stress;
  (5) employing a finite element software to establish a finite element model of the small work-piece, performing numerical modal analysis for the small work-piece to obtain natural frequencies of bending vibration of various orders of the small work-piece, displacement modes and strain modes of the bending vibration of the various orders corresponding to the natural frequencies, and storing the natural frequencies, the displacement modes and the strain modes of the bending vibration of the various orders of the small work-piece;
  (6) determining a distribution region of peak strain on each strain mode of the bending vibration according to the strain modes of the bending vibration of the various orders stored in step (5), and storing the distribution region of the peak strain for each order; recording the natural frequency corresponding to the strain mode wherein the distribution region of the peak strain of the strain mode is consistent with the distribution region of the peak residual stress on the small work-piece, with a criterion as follows:

$$\frac{|X_r - X_\varepsilon|}{X_r} \times 100\% \leq 5\%,$$

with $X_r$ denoting coordinate of a starting position of the distribution region of the peak residual stress in an x-axis direction on the small work-piece, $X_\varepsilon$ denoting coordinate of a starting position of the distribution region of the peak strain in the x-axis direction on the small work-piece; denoting the natural frequency recorded as a target frequency f for determining the structural dimensions of the high-frequency vibration energy amplification device;

(7) determining the structural dimensions $d_1$, $h_1$, $d_2$, $h_2$, $d_3$, $d_4$, and $h_3$ of the high-frequency vibration energy amplification device with the following steps:

1) Obtaining a minimum value and a maximum value for each of the structural dimensions $d_1$, $h_1$, $d_2$, $h_2$, $d_3$, $d_4$, and $h_3$; divide a length with a starting point of the minimum value and an ending point of the maximum value for each structural dimensions into N segments to obtain N+1 values of each parameter, wherein N is an integer between 3 and 60; formulating $(N+1)^7$ 7-tuples $(p_1, p_2, p_3, p_4, p_5, p_6, p_7)$ as schemes for the finite element model for the high-frequency vibration energy amplification device, wherein $p_i$ is one of the N+1 values of each respective structural dimension, i= 1, . . . , 7;

2) performing numerical modal analysis for each scheme in step 1), and calculating $$\text{delta} = \frac{|f_a - f|}{f} \times 100\%;$$

selecting the scheme corresponding to a minimum value of the delta as the structural dimension scheme of the high-frequency vibration energy amplification device, with $f_a$ denoting the natural frequency of the first order axial vibration of the high-frequency vibration energy amplification device;

(8) analyzing the displacement mode corresponding to the target frequency f stored in step (6) to obtain loci of the vibration node lines and number of the vibration node lines, and storing values thereof;

(9) clamping the small work-piece: mounting the first L-shaped column and the second L-shaped column of the clamping device on the working platform of the high-frequency vibration energy amplification device via screws; clamping the small work-piece on the working platform via the clamping device, and arranging multiple cushion blocks between the working platform and the small work-piece, setting the cushion blocks along the vibration node lines on the small work-piece, with one cushion block for each vibration node line; moving and mounting the pressing device along horizontal and vertical directions of the adjusting beam so that the pressing device clamps the small work-piece on the working platform of the high-frequency vibration energy amplification device; moving and mounting the pressing blocks in the pressing device along horizontal direction of the pressing beam so that the pressing blocks are located against both ends of the vibration node lines on the small work-piece;

(10) attaching strain gauges: attaching the strain gauges on the starting position of the distribution region of the peak residual stress according to the distribution region of the peak residual stress on the small work-piece, the direction of the first principal stress and the direction of the second principal stress stored in step (4), wherein the first strain gauge is attached along the direction of the first principal stress on the small work-piece and the second strain gauge is attached along the direction of the second principal stress on the small work-piece;

(11) connecting the strain gauges with a dynamic strain meter, connecting the dynamic strain meter with a host computer system, connecting the host computer system with a signal generator, connecting the signal generator with a power driver, and connecting the power driver with the electromagnetic exciter.

* * * * *